US007611988B2

(12) United States Patent
Chen et al.

(10) Patent No.: US 7,611,988 B2
(45) Date of Patent: Nov. 3, 2009

(54) DEFECTIVITY AND PROCESS CONTROL OF ELECTROLESS DEPOSITION IN MICROELECTRONICS APPLICATIONS

(75) Inventors: Qingyun Chen, Branford, CT (US);
Charles Valverde, Ansonia, CT (US);
Vincent Paneccasio, Madison, CT (US);
Nicolai Petrov, Hamden, CT (US);
Daniel Stritch, West Haven, CT (US);
Christian Witt, Woodbridge, CT (US);
Richard Hurtubise, Clinton, CT (US)

(73) Assignee: Enthone Inc., West Haven, CT (US)

( * ) Notice: Subject to any disclaimer, the term of this patent is extended or adjusted under 35 U.S.C. 154(b) by 393 days.

(21) Appl. No.: 11/243,631

(22) Filed: Oct. 5, 2005

(65) Prior Publication Data
US 2007/0062408 A1 Mar. 22, 2007

Related U.S. Application Data

(62) Division of application No. 11/230,912, filed on Sep. 20, 2005, now Pat. No. 7,410,899.

(51) Int. Cl.
*H01L 21/44* (2006.01)
(52) U.S. Cl. .................. 438/678; 438/761; 438/778; 438/782; 257/635; 257/766; 204/157.45; 204/157.5; 204/633
(58) Field of Classification Search ............... 438/678, 438/761, 778, 782, FOR. 390, FOR. 405; 257/635, 766, E21.586; 204/157.45, 157.5, 204/633
See application file for complete search history.

(56) References Cited
U.S. PATENT DOCUMENTS

| 3,635,758 | A | | 1/1972 | Schneble, Jr. et al. |
|---|---|---|---|---|
| 3,649,308 | A | | 3/1972 | Gulla et al. |
| 3,745,039 | A | | 7/1973 | Feldstein |
| 3,784,457 | A | * | 1/1974 | Mizutani et al. ............ 204/529 |
| 3,915,717 | A | * | 10/1975 | Feldstein et al. ........... 106/1.23 |
| 3,935,435 | A | | 1/1976 | Greenwood |
| 4,066,804 | A | | 1/1978 | Andrews |
| 4,097,440 | A | | 6/1978 | Maximovich et al. |
| 4,350,822 | A | * | 9/1982 | Albright et al. ............... 560/45 |
| 4,435,490 | A | | 3/1984 | Lelental et al. |
| 4,520,052 | A | | 5/1985 | Skowronek et al. |
| 4,917,758 | A | | 4/1990 | Ishizuka et al. |
| 5,190,852 | A | | 3/1993 | Matsuda et al. |
| 5,198,407 | A | * | 3/1993 | Motegi et al. ............... 503/226 |
| 5,286,704 | A | | 2/1994 | Yoshikawa et al. |
| 5,314,725 | A | | 5/1994 | Morishita |
| 5,364,460 | A | | 11/1994 | Morimoto et al. |
| 5,480,477 | A | | 1/1996 | Feldstein et al. |
| 5,645,628 | A | | 7/1997 | Endo et al. |
| 5,695,810 | A | | 12/1997 | Dubin et al. |
| 5,795,828 | A | | 8/1998 | Endo et al. |
| 5,803,957 | A | | 9/1998 | Murakami et al. |
| 5,897,673 | A | * | 4/1999 | Nishida et al. ................. 8/624 |
| 5,925,415 | A | | 7/1999 | Fry et al. |

(Continued)

OTHER PUBLICATIONS

Office Action dated Jul. 10, 2007, U.S. Appl. No. 11/243,624, filed Oct. 5, 2005.

(Continued)

*Primary Examiner*—N Drew Richards
*Assistant Examiner*—Joannie A Garcia
(74) *Attorney, Agent, or Firm*—Senniger Powers LLP

(57) ABSTRACT

Methods and compositions for electrolessly depositing Co, Ni, or alloys thereof onto a substrate in manufacture of microelectronic devices. Grain refiners, levelers, oxygen scavengers, and stabilizers for electroless Co and Ni deposition solutions.

4 Claims, 4 Drawing Sheets

U.S. PATENT DOCUMENTS

| | | | |
|---|---|---|---|
| 6,117,220 A | 9/2000 | Kodama et al. | |
| 6,156,428 A | 12/2000 | Gibson | |
| 6,162,343 A | 12/2000 | Takami et al. | |
| 6,197,984 B1* | 3/2001 | Makovetsky et al. | 556/146 |
| 6,265,086 B1 | 7/2001 | Harkness | |
| 6,336,962 B1* | 1/2002 | Backus et al. | 106/1.23 |
| 6,413,653 B1 | 7/2002 | Araki et al. | |
| 6,423,125 B1 | 7/2002 | Ishibashi et al. | |
| 6,645,567 B2 | 11/2003 | Chebiam et al. | |
| 6,680,541 B2 | 1/2004 | Furusawa et al. | |
| 6,717,189 B2 | 4/2004 | Inoue et al. | |
| 6,749,739 B2 | 6/2004 | Chalyt et al. | |
| 6,824,666 B2 | 11/2004 | Gandikota et al. | |
| 6,852,210 B2 | 2/2005 | Obata et al. | |
| 6,861,097 B1 | 3/2005 | Goosey et al. | |
| 6,899,816 B2 | 5/2005 | Padhi et al. | |
| 6,905,622 B2 | 6/2005 | Padhi et al. | |
| 7,384,532 B2 | 6/2008 | Parsons, II et al. | |
| 2002/0185658 A1 | 12/2002 | Inoue et al. | |
| 2003/0138571 A1* | 7/2003 | Kunishi et al. | 427/443.1 |
| 2003/0140988 A1 | 7/2003 | Gandikota et al. | |
| 2003/0207560 A1 | 11/2003 | Dubin et al. | |
| 2004/0096592 A1 | 5/2004 | Chebiam et al. | |
| 2004/0134375 A1 | 7/2004 | Kolics et al. | |
| 2004/0142114 A1* | 7/2004 | Kong et al. | 427/443.1 |
| 2004/0144285 A1* | 7/2004 | Stark et al. | 106/1.27 |
| 2004/0200728 A1 | 10/2004 | Hongo et al. | |
| 2004/0206631 A1 | 10/2004 | Cobley et al. | |
| 2004/0245214 A1 | 12/2004 | Katakabe et al. | |
| 2004/0250748 A1 | 12/2004 | Ravenscroft et al. | |
| 2004/0253814 A1 | 12/2004 | Cheng et al. | |
| 2004/0258836 A1* | 12/2004 | Besenhard et al. | 427/180 |
| 2005/0003255 A1 | 1/2005 | Shimizu et al. | |
| 2005/0008786 A1 | 1/2005 | Dubin et al. | |
| 2005/0009340 A1 | 1/2005 | Saijo et al. | |
| 2005/0072525 A1 | 4/2005 | Pancham et al. | |
| 2005/0084615 A1 | 4/2005 | Weidman et al. | |
| 2005/0085031 A1 | 4/2005 | Lopatin et al. | |
| 2005/0089944 A1 | 4/2005 | Shieh et al. | |
| 2005/0095830 A1 | 5/2005 | Weidman et al. | |
| 2005/0101130 A1 | 5/2005 | Lopatin et al. | |
| 2005/0124158 A1 | 6/2005 | Lopatin et al. | |
| 2005/0139118 A1 | 6/2005 | Cobley et al. | |
| 2005/0212058 A1 | 9/2005 | Huang et al. | |
| 2005/0222427 A1 | 10/2005 | Sharpless et al. | |
| 2005/0258499 A1 | 11/2005 | Huang et al. | |
| 2005/0261414 A1 | 11/2005 | Mitsuhashi et al. | |
| 2005/0282384 A1* | 12/2005 | Nawafune et al. | 438/678 |
| 2006/0035807 A1* | 2/2006 | Kasturi et al. | 510/475 |
| 2006/0083850 A1* | 4/2006 | Valverde et al. | 427/58 |
| 2006/0172529 A1 | 8/2006 | Shih et al. | |
| 2006/0280860 A1 | 12/2006 | Paneccasio, Jr. et al. | |
| 2007/0260017 A1* | 11/2007 | Matsuda et al. | 525/266 |
| 2008/0044643 A1 | 2/2008 | Yokota et al. | |

OTHER PUBLICATIONS

International Search Report, PCT/US06/36479, dated Jul. 30, 2008, 2 pages.

Written Opinion, PCT/US06/36479, dated Jul. 30, 2008, 7 pages.

International Preliminary Report on Patentability, PCT/US2006/036479, dated Apr. 7, 2009, 8 pages.

Hirsch, S., et al., "Immersion Plating", *Metal Finishing, Guidebook and Directory Issue '89*, Jan. 1989, pp. 402-407, vol. 67, No. 1A, Metals and Plastics Publications, Inc., Hackensack, New York.

Itabashi, T., et al., "Electroless Deposited CoWB for Copper Diffusion Barrier Metal", *IEEE*, 2002, pp. 285-287.

Kohn, A., et al., "Characterization of Electroless Deposited Co(W,P) Thin lms for Encapsulation of Copper Metallization", *Materials Science & Engineering A*, 2001, pp. 18-25, vol. 302.

Lopatin, S.D., et al., "Thin Electroless Barrier for Copper Films", *Part of the SPIE Conference on Multilevel Interconnect Technology II*, Sep. 1998, pp. 65-77, vol. 3508, Santa Clara, California.

* cited by examiner

US 7,611,988 B2

DEFECTIVITY AND PROCESS CONTROL OF ELECTROLESS DEPOSITION IN MICROELECTRONICS APPLICATIONS

REFERENCE TO RELATED APPLICATION

This is a divisional application of Ser. No. 11/230,912 filed Sep. 20, 2005.

FIELD OF THE INVENTION

This invention relates to electroless plating of Co, Ni, and alloys thereof in microelectronic device applications. More specifically, this invention relates to additives including stabilizers, levelers, grain refiners, and oxygen scavengers in Co and Ni electroless plating baths for microelectronic application.

BACKGROUND OF THE INVENTION

Electroless deposition of Co is performed in a variety of applications in the manufacture of microelectronic devices. For example, Co is used in capping of damascene Cu metallization employed to form electrical interconnects in integrated circuit substrates. Copper can diffuse rapidly into a Si substrate and dielectric films such as, for example, $SiO_2$ or low k dielectrics. Copper can also diffuse into a device layer built on top of a substrate in multilayer device applications. Such diffusion can be detrimental to the device because it can cause electrical leakage in substrates, or form an unintended electrical connection between two interconnects resulting in an electrical short. Moreover, Cu diffusion out of an interconnect feature can disrupt electrical flow. Copper also has a tendency to migrate from one location to another when electrical current passes through interconnect features in service, creating voids and hillocks. This migration can damage an adjacent interconnect line and disrupt electrical flow in the feature where the metal migrates. Cobalt capping is employed to inhibit this Cu diffusion and migration.

Accordingly, among the challenges facing integrated circuit device manufacturers is to minimize diffusion and electromigration of metal in metal-filled interconnect features. This challenge becomes more acute as the devices further miniaturize, and as the features further miniaturize and densify.

Another challenge in the context of metal interconnect features is to protect them from corrosion. Certain interconnect metals, especially Cu, are more susceptible to corrosion. Copper is a fairly reactive metal which readily oxidizes under ambient conditions. This reactivity can undermine adhesion to dielectrics and thin films, resulting in voids and delamination. Another challenge is therefore to combat oxidation and enhance adhesion between the cap and the Cu, and between structure layers.

The industry has deposited Co-based caps over Cu and other metal interconnect features, as discussed in, for example, U.S. Pat. Pub. No. 2003/0207560 and U.S. patent application Ser. No. 10/867,346.

A particular Co-based metal capping layer employed to reduce Cu migration, provide corrosion protection, and enhance adhesion between the dielectric and Cu is a ternary alloy including Co, W, and P. Another refractory metal may replace or be used in addition to W, and B is often substituted for or used in addition to P. Each component of the ternary alloy imparts advantages to the protective layer.

A particular problem for the integration of this technology to current ULSI fabrication lines is high defectivity of the capping layer. In recent years, the defectivity has been an object in inventions relating to plating baths and tools. See Katakabe et al. (U.S. Pat. Pub. No. 2004/0245214), Kolics et al. (U.S. Pat. Pub. No. 2004/0134375), Dubin et al. (U.S. Pat. Pub. No. 2005/0008786), Cheng et al. (U.S. Pat. Pub. No. 2004/0253814), Weidman et al. (U.S. Pat. Pub. No. 2005/0084615), Pancham et al. (U.S. Pat. Pub. No. 2005/0072525), and Saijo et al. (U.S. Pat. Pub. No. 2005/0009340). Defectivity reduction remains a challenge in ULSI fabrication lines.

Typical defects in electroless plated cobalt alloys for use as caps on interconnect features may be summarized as follows.

Nodulation: localized preferential growth or particle formation on the Cu deposit, at Cu/dielectric and Cu/barrier interfaces, and on dielectric surfaces. This problem may be generally caused by a lack of stability of the working bath, and formation of incubation centers in the solution, such as $Co^{3+}$ due to the oxidation of $Co^{2+}$ by dissolved oxygen.

"Grain decoration": uneven morphology of electroless Co film along the Cu line that replicates Cu erosion before plating and/or unevenly grown Co film due to initiation delay at Cu grain interfaces. Such growth can contribute to overall deposit roughness.

Granularity: irregularly sized nanocrystallites and clusters of amorphous electroless deposits of Co and its alloys with large grains and well-defined grain interfaces. This type of morphology can contribute to surface roughness.

Non-uniform growth: varying deposit thickness along the Cu substrate due to different plating rate of electroless Co on different size features, features located in different areas, dense and isolated, and/or features with different surface areas.

Pitting: the formation of pits or pinholes due to localized incomplete Cu surface coverage or extensive hydrogen bubble formation during the deposition process of the electroless film.

Those defects decrease diffusion barrier effectiveness, lower the capability of the capping layer to suppress electromigration, cause electromigration failure, affect the signal propagation across the circuitry, increase current leakage, and may even result in electrical shorts.

Therefore, a need continues to exist for substantially defect free, uniform, and smooth electrolessly deposited capping layers over Cu interconnects.

SUMMARY OF THE INVENTION

Among the various aspects of the invention may be noted the provision of methods and compositions for Co and Ni electroless plating which yield substantially defect free or very low defectivity alloys suitable for various applications in microelectronic devices. In one aspect, the methods and compositions are especially suitable for capping. The alloys are deposited from electroless deposition compositions comprising one or more additives selected from among defect-reducing additives, including stabilizers, levelers, grain refiners, and oxygen scavengers. This invention does not require use of all these additives. And in different aspects the invention is directed to these additives separately. These additives could be defined as follows:

Stabilizers: additives for an electroless plating composition that reduce spontaneous decomposition of the bath and uncontrollable precipitation of the metal in the volume of the solution. For example, stabilizers suppress nodular, stray growth, and extensive hydrogen evolution, thereby preventing pitting.

Levelers: additives for an electroless plating composition that help to equalize the growth rate of the Co film on different Cu grains and at Cu grain interfaces, on different size features, features located in different areas, dense and isolated, and/or features with different surface areas. Thus, levelers promote formation of an electroless Co film with even morphology, low roughness, and uniform thickness of Co on different Cu features.

Grain refiners: additives for an electroless plating composition that promote formation of the electroless film with uniformly sized grains and smooth grain interfaces. Grain refiners, consequently, reduce granularity of the deposit and improve roughness.

Oxygen scavengers: additives for electroless plating composition that chemically interact with dissolved oxygen to form inactive species, thereby consuming oxygen. Oxygen scavengers, in turn, inhibit oxidation of $Co^{2+}$ to $Co^{2+}$, inhibit incubation center formation in the solution volume, and affect nodulation on dielectric surface.

Briefly, therefore, the invention is directed to a method and composition for electrolessly depositing Co, Ni, or alloys thereof onto a substrate in manufacture of microelectronic devices, the method comprising contacting the substrate with an electroless deposition composition comprising (a) a grain refiner comprising a grain refiner compound selected from the group consisting of a polyphosphoric acid and a polyphosphate salt, and (b) a source of deposition ions selected from the group consisting of Co ions and Ni ions.

The invention is also directed to a method and composition for electrolessly depositing Co, Ni, or alloys thereof onto a substrate in manufacture of microelectronic devices, the method comprising contacting the substrate with an electroless deposition composition comprising (a) an oxygen scavenger selected from the group consisting of ascorbic acid, $SO_3^{2-}$, $HSO_3^-$, hydroquinone, catechol, resorcinol, hydrazine, and combinations thereof and (b) a source of deposition ions selected from the group consisting of Co ions and Ni ions.

In another aspect the invention is directed to a method and composition for electrolessly depositing Co, Ni, or alloys thereof onto a substrate in manufacture of microelectronic devices, the method comprising contacting the substrate with an electroless deposition composition comprising (a) a stabilizer selected from the group consisting of an aminobenzoic acid, an hydroxybenzoic acid, a molybdenum oxide, a vanadium oxide, rhenium oxide, salts thereof, derivatives thereof, and combinations thereof; and (b) a source of deposition ions selected from the group consisting of Co ions and Ni ions.

The invention is further directed to a method and composition for electrolessly depositing Co, Ni, or alloys thereof onto a substrate in manufacture of microelectronic devices, the method comprising contacting the substrate with an electroless deposition composition comprising (a) a leveler selected from the group consisting of diphenyl oxide disulfonic acids, triethanolamine salts of lauryl sulfate, ammonium laureth sulfates, alkylbenzene sulfonates, dodecylbenzene sulfonic acids, alkyldiphenyloxide disulfonate, low molecular weight polypropylene glycol, and combinations thereof and (b) a source of deposition ions selected from the group consisting of Co ions and Ni ions.

Other objects and features of the invention will be in part apparent and in part pointed out hereinafter.

DETAILED DESCRIPTION OF PREFERRED EMBODIMENT(S)

Figure 1A:
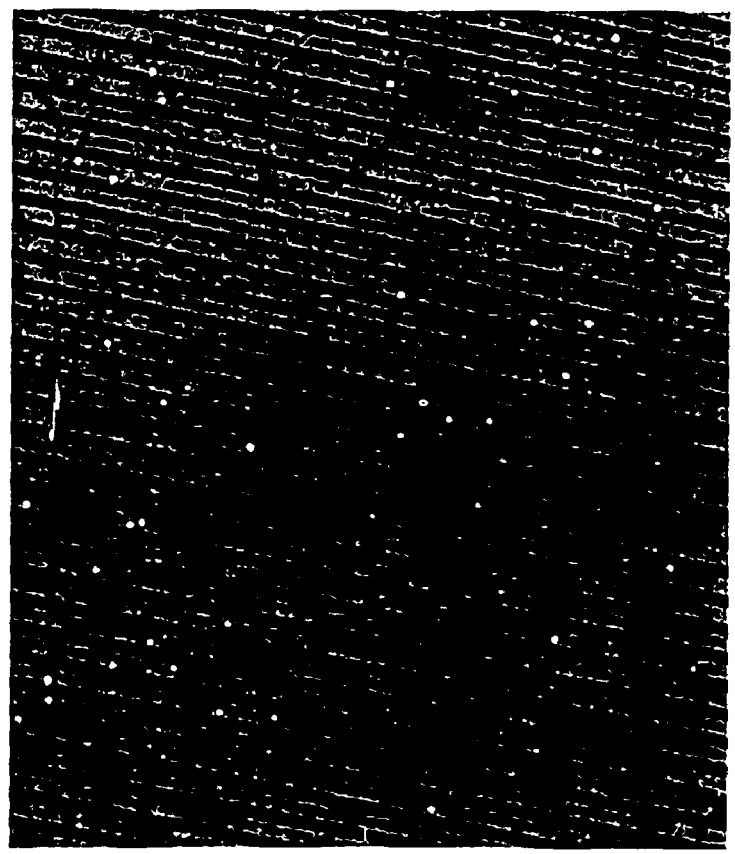
FIGS. 1A and 1B are AFM images showing Co alloy deposits prepared according to the method described in Example 8.

In accordance with the invention, Co and Ni alloys are deposited using methods and compositions which yield a uniform deposit with excellent selectivity and enhanced smoothness and planarity. Additionally, the deposit is substantially free of nodular growth and isolated alloy particles on the dielectric. For example, a smooth electroless cap can be electrolessly deposited over an interconnect feature in a microelectronic device. The invention is described here in the context of Co-based caps and Ni-based caps, but is also applicable to other electroless Co and Ni applications in the microelectronics industry.

The present invention stems from the discovery that depositing a Co-based or Ni-based cap from an electroless deposition composition incorporating one or more of a variety of defect-reducing additives including certain stabilizers, levelers, grain refiners, and oxygen scavengers improves the overall topography and morphology of the deposit. Incorporating these various defect-reducing additives improves the bath stability, reduces the formation of particles on the dielectric surface in between Cu features, improves surface roughness, controls and thereby reduces the formation of pits in the deposit, and refines the grain size for better morphology, i.e., smaller grain size and an overall amorphous deposit. An electroless plating composition of the present invention may comprise one, more than one, or all of the classes of defect-reducing additives, the classes being broadly defined as stabilizers, levelers, grain refiners, and oxygen scavengers. Classifying an additive into one of these four classes is not meant to delimit its function in the bath. It has been observed that many of the additives have multiple functions in the bath, i.e., the additives may function both as stabilizers and grain refiners, for example. The function of each defect-reducing additive is directed broadly toward improving the bath stability and reducing defects in the plated alloy. Additionally, the electroless deposition compositions of the present invention may include one or more of the additives from each class, i.e., the bath may include two or more stabilizers, for example.

Oxime and its derivatives, amino- and hydroxyl-benzoic acids and derivatives thereof, and refractory metal oxides when added to the electroless deposition compositions of the present invention act as stabilizers.

Conventional stabilizers used in electroless Co and Ni plating include heavy metals such as Pb and Cd or sulfur compounds such as thiourea and mercaptosuccinic acid. These stabilizers perform adequately for electroless Co and Ni plating baths by reducing plating bath decomposition. However, conventional stabilizers are disadvantageous for use in electroless deposition compositions for depositing Co and Ni caps in microelectronic applications because the presence of these stabilizers results in the co-deposition of heavy metals or sulfur into the Co or Ni alloy cap. As such, in certain embodiments of the invention, these conventional stabilizers are replaced with stabilizers selected from the group oxime and oxime derivatives, amino-substituted and hydroxyl-substituted benzoic acids and derivatives thereof, and refractory metal oxides.

Exemplary oxime-based compound stabilizers for use in these embodiments of the present invention include ketoximes and aldoximes. Ketoximes are commonly formed by a condensation reaction between ketones and hydroxylamine or hydroxylamine derivatives. Exemplary ketoximes include dimethylglyoxime, 1,2-cyclohexanedione dioxime, diphenylglyoxime, and pyridyl diglyoxime. Aldoximes are commonly formed by a condensation reaction between aldehydes and hydroxylamine or hydroxylamine derivatives. Exemplary aldoximes include salicylaldoxime and syn-2-pyridinealdoxime. In the context of this description, "oxime-based" refers to compounds which comprise the functional group of the type formed by a condensation reaction between hydroxylamine or a hydroxylamine derivative and a carbonyl group, which carbonyl group may be either a ketone or an aldehyde; including such compounds whether formed by this condensation reaction or by some other mechanism, as it is the functional group, not the reaction mechanism, which is important. The structures of some oxime-based compound stabilizers are shown in Table I.

TABLE I

Oxime-Based Compounds for Use as Stabilizers

| Name | Structure |
| --- | --- |
| Dimethylglyoxime | |
| Salicylaldoxime | |
| 1,2-Cyclohexanedione dioxime | |
| syn-2-Pyridinealdoxime | |
| Diphenylglyoxime | |
| Pyridyl diglyoxime | |

Advantageously, when oxime-based compounds are added to Co-based electroless plating baths, the stabilizers reduce stray deposition of Co or Co alloys onto the dielectric and reduce the formation of Co-based nodules in the deposited cap. Without being bound to a particular theory, it is preliminarily believed that the stabilizing capacity of these compounds may be related to their chelating strength, in that oximes chelate metal ions in solution more strongly than the primary chelator, which may be, for example, citric acid. For example, depending upon solution conditions, the log of the stability constant, k, of Cu with dimethylglyoxime may be between about 9 and about 11. The log k of Ni with dimethylglyoxime may be between about 12 and about 17. Conversely, the log k of Cu with citric acid may be between about 4 and about 6, and the log k of Ni with citric acid may be between about 4 and about 6. Co, on the other hand, is still chelated by the primary chelator, citric acid. Dimethylglyoxime preferentially chelates metal impurities such as Ni, Cu, and others and shifts their reduction potentials, thus avoiding the tendency of localized nucleation and particle formation. Excess amounts of dimethylglyoxime may further chelate with Co and affect the rate of Co deposition. However, because of the strong chelating effect, the plating bath is completely deactivated when the concentration level reaches 200 ppm or higher.

In the baths of these embodiments of the invention, the concentration of the oxime-based compound stabilizer is between about 2 ppm to about 150 ppm. Hereinafter, the term "ppm" shall refer to the concentration of an additive in mass units of additive per mass units of plating solution. For example, 5 ppm shall mean 5 mg of the additive per kilogram of plating solution. Because the density of the solution is approximately 1 kg/L, a 5 ppm concentration is approximately 5 mg per Liter of plating solution. Under such conditions, the oxime-based compound acts as a bath stabilizer and a leveler of the deposit.

Oxime-based compounds are added to the bath in a concentration range of about 2 ppm to about 150 ppm, preferably from about 5 ppm to about 50 ppm, even more preferably about 5 ppm to about 20 ppm.

In another embodiment of the invention, the stabilizer may alternatively or additionally include aminobenzoic acids, salts thereof, and derivatives thereof or hydroxybenzoic acids, salts thereof, and derivatives thereof. Exemplary aminobenzoic acids include 2-aminobenzoic acid (anthranilic acid, ortho-aminobenzoic acid), 3-aminobenzoic acid (meta-aminobenzoic acid), 4-aminobenzoic acid (para-aminobenzoic acid, PABA), and derivatives thereof, with 2-aminobenzoic acid currently preferred. Exemplary aminobenzoate salts include 2-aminobenzoate salts, 3-aminobenzoate salts, 4-aminobenzoate salts, and derivatives thereof. The aminobenzoate salts may include counterions selected from among sodium, potassium, and ammonium, preferably potassium and ammonium. Exemplary hydroxybenzoic acids include salicylic acid (2-hydroxybenzoic acid, ortho-hydroxybenzoic acid), 3-hydroxybenzoic acid (meta-hydroxybenzoic acid), 4-hydroxybenzoic acid (para-hydroxybenzoic acid), 2,3-dihydroxybenzoic acid, 2,4-dihydroxybenzoic acid, 2,5-dihydroxybenzoic acid, 2,6-dihydroxybenzoic acid, 3,4-dihydroxybenzoic acid, 3,5-dihydroxybenzoic acid, 2,3,4-trihydroxybenzoic acid, 2,3,6-trihydroxybenzoic acid, 2,4,5-trihydroxybenzoic acid, 2,4,6-trihydroxybenzoic acid, 3,4,5-trihydroxybenzoic acid (Gallic acid), and derivatives thereof. Exemplary hydroxybenzoate salts include salicylate salts, 3-hydroxybenzoate salts, 4-hydroxybenzoate salts, 2,3-dihydroxybenzoate salts, 2,4-dihydroxybenzoate salts, 2,5-dihydroxybenzoate salts, 2,6-dihydroxybenzoate salts, 3,4-dihydroxybenzoate salts, 3,5-dihydroxybenzoate salts, 2,3,4-trihydroxybenzoate salts, 2,3,6-trihydroxybenzoate salts, 2,4,5-trihydroxybenzoate salts, 2,4,6-trihydroxybenzoate salts, 3,4,5-trihydroxybenzoate salts, and derivatives thereof. The hydroxybenzoate salts may include counterions selected from among sodium, potassium, ammonium, preferably potassium and ammonium. Exemplary aminohydroxybenzoic acid stabilizers are 5-aminosalicylic acid, 2-amino-5-hydroxybenzoic acid (5-hydroxyanthranilic acid), and other hydroxyl-substituted anthranilic acids, which may be present as acids, salts thereof, or derivatives thereof. Derivatives of all of the above listed benzoic acid-based stabilizers include those which have amino (—NH$_2$), nitro (—NO$_2$), and methyl (—CH$_3$) or higher alkyl chain substituents on the aromatic ring. For example, an exemplary nitro derivative of salicylic acid may be 3,5-dinitrosalicylic acid, which may be present as the acid or salt thereof. In the baths of the invention, the concentration of these organic acids may be between about 2 ppm and about 1500 ppm, such as between about 5 ppm and 1000 ppm. In one preferred embodiment it is between about 5 ppm and about 30 ppm, such as between about 20 and 30 ppm. If the concentration is too low, the effect is not realized. If it is too high, initiation and growth are overly retarded. The structures of some benzoic acid-based stabilizers are shown in Table II.

TABLE II

Benzoic Acid-Based Stabilizers

| Name | Structure |
|---|---|
| 2-aminobenzoic acid (anthranilic acid, ortho-aminobenzoic acid) | |
| 3-aminobenzoic acid (meta-aminobenzoic acid) | |
| 4-aminobenzoic acid (para-aminobenzoic acid) | |
| salicylic acid (2-hydroxybenzoic acid, ortho-hydroxybenzoic acid) | |
| 3-hydroxybenzoic acid (meta-hydroxybenzoic acid) | |
| 4-hydroxybenzoic acid (para-hydroxybenzoic acid) | |
| 2,3,6-trihydroxybenzoic acid | |
| 5-aminosalicylic acid | |

The stabilizing mechanism of the aminobenzoic and hydroxybenzoic acids is believed to be related to the acid chelating strength. Without being bound to a particular theory, it is believed that these compounds, similarly to the oximes, may preferentially chelate impurities such as Cu and others introduced from raw materials or the substrate and thereby suppress their spontaneous deposition while leaving Co substantially chelated by the weak primary chelator, which may be, for example, citric acid, and thus readily available for plating. For example, in baths where DMAB is used as a reducing agent, Cu ions introduced from Cu erosion during plating can cause particle formation or decomposition in the bath. Particle formation may be avoided due to strong chelating of the organic acids for Cu ions. For example, the log of the stability constant (log K or pK) of salicylic acid with Cu ions is about 11, which is much higher than with Co ions (pK of about 6), while the pK for the primary chelator, such as citric acid, with Co and Cu is around 4 to 6. Excess amounts of these stabilizers may further chelate with Co and affect the initiation and growth rate of the alloy deposit. Because of the strong chelating effect, plating may be completely inhibited when the concentration exceeds 3000 ppm.

Advantageously, when the stabilizer is an oxime, an oxime derivative, an aminobenzoic acid, or a hydroxybenzoic acid, the stabilizer avoids bath decomposition and co-deposition of undesired impurities in the Ni or Co alloy cap.

Exemplary refractory metal oxides for use as bath stabilizers in other embodiments of the invention include molybdenum oxides, rhenium oxides, and vanadium oxides. Exemplary sources of molybdenum oxides include molybdate salts such as MoO$_3$ predissolved with TMAH; (NH$_4$)$_2$MoO$_4$; (NH$_4$)$_2$Mo$_2$O$_7$; (NH$_4$)$_6$Mo$_7$O$_{24}$.4H$_2$O; (NH$_4$)$_2$Mo$_3$O$_{10}$.2H$_2$O; (NH$_4$)$_6$Mo$_8$O$_{27}$.4H$_2$O; dimolybdates (Me$_2$Mo$_2$O$_7$.nH$_2$O); trimolybdates (Me$_2$Mo$_3$O$_{10}$.nH$_2$O); tetramolybdates (Me$_2$Mo$_4$O$_{13}$); metamolybdates (Me$_2$H$_{10-m}$[H$_2$(Mo$_2$O$_7$)$_6$].nH$_2$O; wherein m is less than 10); hexamolybdates (Me$_2$Mo$_6$O$_{19}$.nH$_2$O); octamolybdates (Me$_2$Mo$_8$O$_{25}$.nH$_2$O); paramolybdates (Me$_2$Mo$_7$O$_{22}$.nH$_2$O and Me$_{10}$Mo$_{12}$O$_{41}$.nH$_2$O); wherein in the above Me is a counterion selected from among ammonium, tetramethylammonium, and alkali metal cations and wherein n is an integer having a value corresponding to a stable or metastable form of the hydrated oxide; molybdic acids; molybdic acid salts of ammonium, tetramethylammonium, and alkali metals; heteropoly acids of molybdenum; and other mixtures thereof. The concentration of molybdenum oxide is between about 10 ppm and about 800 ppm, preferably between about 10 ppm and about 30 ppm for low metal baths and between about 100 ppm and about 500 ppm for high metal baths. At too low a concentration, the effect is not realized. At too high a concentration, initiation and growth are adversely affected. Exemplary sources of vanadium oxides include vanadate salts such as triammonium salts, metavanadate salts such as ammonium or sodium salts, pyrovanadates (V$_2$O$_7^{4-}$), hexavanadates (HV$_6$O$_{17}^{3-}$), V$_2$O$_3$, V$_2$O$_4$, and V$_2$O$_5$. Preferably, the vanadium oxides are selected from among compounds which are easily dissolved in alkaline solution to form the needed oxide ions. The concentration of vanadium oxide is between about 1 ppm and about 100 ppm, preferably between about 2 ppm and about 5 ppm for low metal baths and between about 5 ppm and about 20 ppm for high metal baths. Exemplary sources of rhenium oxides include rhenium trioxides, perrhenic acids, ammonium perrhenic acid salts, tetramethylammonium perrhenic acid salts, alkali metal perrhenic acid salts, heteropolyacids of rhenium, and other mixtures thereof. The concentration of rhenium oxide is between about 2 ppm and about 300 ppm, preferably between about 5 ppm and about 10 ppm for low metal baths and between about 10 ppm and about 100 ppm for high metal baths.

Molybdenum oxide stabilizers appear to better enhance uniformity in the deposit. At higher concentration levels, it is observed that the addition of molybdenum oxides to the electroless bath reduces particle formation on the deposit and dielectric surfaces, thus improving the selectivity of the barrier.

As an additional advantage, when refractory metal oxides are used as stabilizers, reduction of the oxides may result in the co-deposition of the refractory metal into the Ni or Co alloy cap. The co-deposition of Mo from electroless baths comprising molybdenum oxides into the alloy cap is especially high, ranging from about 0.5 atomic % to about 12 atomic %. Advantageously, the thermal stability of the deposit is enhanced when Mo is co-deposited with W, a refractory metal commonly deposited into Co-based alloys. Additionally, it is thought that Mo, Re, and V co-deposition into the alloy cap functions to increase corrosion resistance and diffusion resistance.

Levelers for use in the electroless deposition compositions of certain embodiments of the present invention include diphenyl oxide disulfonic acids such as Calfax 10LA-75, triethanolamine salts of lauryl sulfate such as Calfoam TLS-40, ammonium laureth sulfates such as Calfoam EA 603, alkylbenzene sulfonates such as Calsoft L-40C and Calsoft AOS-40, dodecylbenzene sulfonic acids such as Calsoft LAS-99, alkyldiphenyloxide disulfonate salts such as Dowfax 3b2, and soluble, low molecular weight polypropylene glycol containing compounds such as PPG 425.

Conventional levelers used in electroless Co and Ni plating baths include phosphate esters such as Polystep P-32 and Rhodafac RE-610 or EO/PO polymers such as Tetronic 304. These are used in most of the electroless deposition compositions in the patent and scientific literature. These levelers, which act as surfactants and surface tension reducers, are thought to be necessary additives for Co and Ni electroless deposition compositions, especially for capping applications, to achieve satisfactory uniformity in the deposited alloy cap. These additives improve the uniformity of the deposited alloy, but disadvantageously have negative effects on selectivity, which in turn affects the deposit morphology by increasing particle formation.

These conventional surfactants are substituted with the levelers listed above in accordance with certain embodiments of the invention. The levelers of the invention, which act as surfactants and surface tension reducers, are effective in reducing surface roughness and improving uniformity in the deposited alloy, without the negative effect of particle or nodule formation. Without being bound to a particular theory, the levelers of the present invention appear to better promote wetting of the metal interconnect surface, which thereby enhances the deposition uniformity. The leveler may serve as a mild deposition inhibitor which can suppress three-dimensional growth to an extent, thereby improving morphology and topography of the film. The levelers of the present invention may also help refine the grain size, which yields a more uniform coating which has grain boundaries which are less porous to migration of Cu. In the baths of the invention, the concentration of the leveler may be between about 20 ppm and about 800 ppm, preferably between about 100 ppm and about 250 ppm. At too low a concentration, the desired effect is not realized. At too high a concentration, there are increased tendencies toward foaming, particle formation in the deposit, and lack of solubility.

In a different aspect, the invention is directed to grain refiners for use in electroless deposition, including polyphosphoric acid or polyphosphate salts. These grain refiners improve the deposit uniformity, granularity of the deposit, and surface roughness. Sources of polyphosphoric acid and polyphosphate salts include ammonium polyphosphate and sodium polyphosphate, and others of the formula M$_{(n+2)}$P$_n$O$_{(3n+1)}$, where M represents a counter ion including hydrogen, and n is greater than or equal to three, for example, n=3 to 600. These include tripolyphosphates, tetrapolyphosphates, etc., in contrast to the orthophosphates (P) and pyrophosphates (P—P). A suitable polyphosphate structure is linear and unbranched as follows, where M is a H+ or a monovalent metal cation:

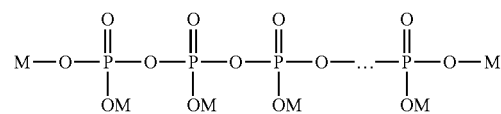

Other suitable polyphosphate structures are branched, such as in the following fragment:

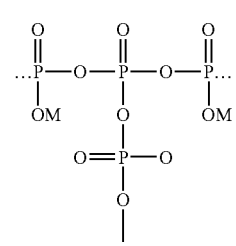

Some commercially available sources of polyphosphates and polyphosphoric acids include certain low quantities of ortho- and pyro-compounds. Accordingly, there are embodiments of the invention which use polyphosphates or polyphosphoric acids as the grain refiner compounds, and ortho- and/or pyro-compounds are also present. And there are embodiments in which ortho- and pyro-phosphate and phosphoric acid compounds are specifically excluded.

Some commercially available sources of polyphosphates and polyphosphoric acids include certain quantities of cyclophosphate (metaphosphate) compounds. These include compounds of the formula $(MPO_3)_n$, where M is a H+ or a metal cation, and n=3 to 600. Examples include cyclotriphosphate and cyclotetratphosphate of the following structures (a) and (b), respectively:

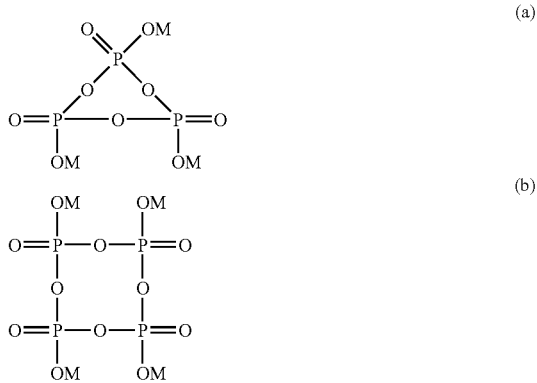

In certain embodiments of the invention, the concentration of the grain refiners may be between about 1 g/L and about 100 g/L, preferably between about 4 g/L and about 50 g/L. If the concentration is too low, the effect is not realized. If it is too high, there is increased chelating of Co and therefore negative effect on plating rate. Without being bound to a particular theory, it is thought that polyphosphoric acid chelates cobalt ions present in the electroless bath. The addition of this second chelator to the bath changes the equilibrium of the bath, thus modifying the morphology of the deposit. That is, when polyphosphate is added to the bath, more phosphorous is co-deposited, resulting in smaller granularity and a more amorphous deposit, which improves the barrier property on Cu diffusion and thermal stability against Co or Ni recrystallization. Phosphorous contents in the deposit are, for example, between 10 and 12 atomic % as compared to, for example, 7 to 9% without the grain refiner. It is also observed that most of the formulations tested with the addition of polyphosphoric acid in the baths further prevent stray deposition on the dielectric. The raw material sources can be from polyphosphoric acid or polyphosphate salts.

In a different aspect this invention is directed to oxygen scavengers for use in certain embodiments of electroless compositions. Typically electroless deposition compositions contain chelated $Co^{2+}$ ions when solution pH is higher than 7.5. In the presence of dissolved oxygen and chelator, $Co^{2+}$ ions tend to oxidize to form $Co^{3+}$ ions. Also, Co solutions have poor shelf life due to the ease of oxidation of $Co^{2+}$ to $Co^{3+}$. Besides the storage conditions, the ease of oxidation of $Co^{2+}$ solution is formulation dependent. Degradation is faster if there is an ammonium-containing component such as ammonia, DEA, TEA, or the like. Degradation is typically slower in non-ammonium systems. $Co^{3+}$ decreases bath activity, and, in extreme cases, may eventually prevent alloy plating. Additionally, $Co^{3+}$ ions form low solubility salts with components of the solution, causing the formation of particles in the bath. Conventionally, in order to extend the shelf life of the product, Co compositions were specially packaged, but the packaging methods increased the cost of the composition. A less expensive alternative besides purging with inert gases, adding an oxygen scavenger to the Co electroless deposition compositions of the present invention, has been presently discovered. A wide variety of oxygen scavengers may inhibit Co oxidation and improve the shelf life of the solutions, but the inventors have discovered a select few which do not unduly interfere with deposition initiation and/or selectivity. A preferred oxygen scavenger for the electroless deposition compositions of the present invention is ascorbic acid. Other preferred oxygen scavengers include sulfites such as $SO_3^{2-}$ and $HSO_3^-$. Examples of $SO_3^{2-}$ sulfites include sodium sulfite, potassium sulfite, ammonia sulfite. Other organic chemicals such as hydroquinone, catechol, resorcinol, hydrazine are candidates for this application. Besides shelf life improvement, the addition of these additives to the baths reduces the induction time of cobalt deposition, thus preventing Cu erosion from the plating solution during the initiation period, which may cause grain decoration and pitting defects. In the baths of the invention, the concentration of ascorbic acid may be between about 0.1 g/L and about 5 g/L, preferably between about 0.5 g/L and about 2 g/L. The concentration of the sulfites may be between about 0.01 g/L and about 1 g/L, preferably between about 0.01 g/L and about 0.3 g/L. The concentration of the hydroquinone, catechol, resorcinol, hydrazine may be between about 0.01 g/L and about 0.5 g/L, preferably between about 0.01 g/L and about 0.1 g/L. The concentration is selected to be at least enough to consume oxygen dissolved in the solution during manufacture and packaging, with some excess for bottle breathing. On the other hand, the concentration is selected not to be so high as to have a negative effect on plating. These additives can also be used in other non-metal (Co or Ni) containing solutions as oxygen scavengers to improve the plating bath performance.

The electroless deposition compositions of the present invention for electroless plating of Co or Ni alloys such as in a metal capping layer onto a metal-filled interconnect may comprise one or more of the above-identified classes of defect-reducing additives, including stabilizers, grain refiners, levelers, and oxygen scavengers. Moreover, the compositions may comprise one or more defect-reducing additives from each class for additive effects. The compositions generally additionally comprise a source of deposition ions, a reducing agent, and a complexing and/or chelating agent. The bath is buffered within a certain pH range. Optionally, the bath may also comprise a source of refractory ions.

For the deposition of a Co-based alloy, the bath comprises a source of Co ions. In the context of capping of electrical interconnects, Co-based alloys provide several advantages. They do not significantly alter the electrical conductivity characteristics of Cu. Cobalt provides good barrier and electromigration protection for Cu. Cobalt, which is selected in significant part because it is immiscible with Cu, does not tend to alloy with Cu during assembly or over time during service. The Co ions are introduced into the solution as an inorganic Co salt such as the hydroxide, chloride, sulfate, or other suitable inorganic salt, or a Co complex with an organic carboxylic acid such as Co acetate, citrate, lactate, succinate, propionate, hydroxyacetate, or others. $Co(OH)_2$ may be used where it is desirable to avoid overconcentrating the solution with $Cl^-$ or other anions. In one embodiment, the Co salt or complex is added to provide about 2 g/L to about 20 g/L of $Co^{2+}$ to yield a Co-based alloy of high Co metal content. In some applications, the Co content in the electroless bath is very low, for example, as low as between about 0.5 g/L and about 2.0 g/L of $Co^{2+}$.

The bath may instead or additionally comprise a source of Ni ions, which is introduced into the solution as an inorganic Ni salt such as chloride, sulfate, or other suitable inorganic salt, or a Ni complex with an organic carboxylic acid such as Ni acetate, citrate, lactate, succinate, propionate, hydroxyacetate, or others. In one embodiment, the inorganic Ni salt is $Ni(OH)_2$. The Ni salt or complex is added to provide about 1 g/L to about 20 g/L of $Ni^{2+}$.

Depending upon the deposition mechanism and the desired alloy, the reducing agent is chosen from either a phosphorus-based reducing agent or a borane-based reducing agent. The deposition mechanism and the desired alloy dictate the choice of the reducing agent. If an alloy is desired which contains phosphorus, hypophosphite is chosen. If an alloy is desired which contains boron, a borane-based reducing agent is chosen, such as borohydride or a borane. Additionally, both phosphorous and borane-based reducing agents may be added to the plating bath.

Among the phosphorus-based reducing agents, hypophosphite is a preferred reducing agent in electroless plating films because of its low cost and docile behavior as compared to other reducing agents. When hypophosphite is chosen as the reducing agent, the finished alloy contains phosphorus. As is known, the plating solution requires an excess of $H_2PO_2^-$ to reduce $Co^{2+}$ into the Co alloy. As noted in Mallory and Hajdu, pp. 62-68, the molar ratio of Co ions to hypophosphite ions in the plating solution is between 0.25 to 0.60, preferably between 0.30 and 0.45, for example. To ensure that a sufficient concentration of hypophosphite is present in the plating bath for rapid initiation of plating and improved plating morphology, the hypophosphite salt is added in an initial concentration of about 2 g/L to about 30 g/L, for example about 21 g/L. Exemplary hypophosphite salts include ammonium hypophosphite, sodium hypophosphite, and potassium hypophosphite.

Hypophosphite reduces the metal ion spontaneously only upon a limited number of substrates, including Co, Ni, and Pd. Not included in this list is Cu, which is a particular metal of interest for its use in filling interconnect features such as vias and trenches in microelectronic devices. For hypophosphite reduction over a Cu substrate, the Cu surface must first be activated, for example, by seeding with the metal to be deposited (i.e., Co) by treating the surface with a solution comprising a strong reducing agent such as DMAB and ions of the metal to be plated (i.e., $Co^{2+}$) or by seeding with a catalyst such as Pd.

Other preferred reducing agents include the borane-based reducing agents, such as borohydrides (sodium, potassium, cyano, trimethoxy, and tetramethylammonium, among others), monomethyl amine borane, isopropyl amine borane, dimethyl amine borane (DMAB), diethyl amine borane (DEAB), trimethyl amine borane, triethyl amine borane, triisopropyl amine borane, pyridine borane, and morpholine borane. When a borane-based reducing agent is chosen, boron becomes part of the plated alloy. As is known, the plating solution requires approximately equal molar amounts of the borane-based reducing agent to reduce $Co^{2+}$ into the Co alloy. To ensure that a sufficient concentration of reducing agent for self-initiated deposition is present in the plating bath, dimethyl amine borane, for example, is added in an initial concentration of about 0.5 g/L to about 30 g/L, for example about 10 g/L.

Unlike hypophosphite, plating solutions with borane-based reducing agents do not need a copper surface activation step. Instead, the reducing agent catalyzes reduction of the metal ion onto the Cu surface.

Due to the oxidation of the reducing agent, P or B co-deposits with the Co or Ni. An effect of these elements in the deposit is to reduce grain size, enhance amorphousness, which can render the microstructure more impervious to Cu diffusion and electromigration. For example, Co—W—B with high W content has an amorphous phase. Without being bound to a particular theory, it is believed that the presence of refractory metal together with B and P improves the barrier properties by filling in the grain boundaries of the crystalline structure of the deposit.

The bath further may contain agents for pH adjustment and buffering agents. The bath pH is typically controlled by one or more pH adjusters and typically contains a pH buffer to stabilize the pH within the desired pH range. In one embodiment, the desired pH range is between about 7.5 and about 10.0. In one embodiment, it is between 8.0 up to around 10. Exemplary agents for pH adjustment include potassium hydroxide (KOH), tetramethylammonium hydroxide (TMAH), tetraethylammonium hydroxide (TEAOH), tetrapropylammonium hydroxide (TPA), tetrabutylammonium hydroxide (TBAOH), MTEOH, ETEOH, BTEOH, ammonia, and other amines. Exemplary buffering agents include, for example, borates, tetra- and pentaborates, phosphates, ammonia, and hydroxyl amines such as monoethanolamine, diethanolamine, triethanolamine, and ethylenediamine, among others. The pH buffer level is on the order of between about 2 g/L and about 50 g/L.

A complexing and/or chelating agent helps to keep Co ions in solution. Because the bath is typically operated at a mildly alkaline pH of between about 7.5 and about 10.0, $Co^{2+}$ ions have a tendency to form hydroxide salts and precipitate out of solution. The complexing agents used in the bath are selected from among citric acid, malic acid, glycine, propionic, succinic, lactic acids, methanolamine (MEA), diethanolamine (DEA), triethanolamine (TEA), and ammonium salts such as ammonium chloride, ammonium sulfate, ammonium hydroxide, pyrophosphate, polyphosphate, and mixtures thereof. Some complexing agents, such as cyanide, are avoided because they complex with Co ions too strongly and can prevent deposition from occurring. The complexing agent concentration is selected such that the molar ratio between the complexing agent and Co is between about 2:1 and about 10:1, generally. Depending on the complexing agent molecular weight, the level of complexing agent may be on the order of between about 10 g/L and about 200 g/L.

If desired, the plating bath may also include a refractory metal ion, such as W or Re, which functions to increase thermal stability, corrosion resistance, and diffusion resistance. Exemplary sources of W ions are tungsten trioxide, tungstic acids, ammonium tungstic acid salts, tetramethylammonium tungstic acid salts, and alkali metal tungstic acid salts, phosphotungstic acid, silicotungstate, other heteropolytungstic acids and other mixtures thereof. For example, one preferred deposition bath contains between about 0.1 g/L and about 10 g/L of tungstic acid. Other sources of refractory metal include rhenium trioxides, perrhenic acids, ammonium perrhenic acid salts, tetramethylammonium perrhenic acid salts, alkali metal perrhenic acid salts, heteropolyacids of rhenium, and other mixtures thereof.

Other additives, as are known in the art such as levelers, accelerators, and grain refiners may also be added. At low concentrations, hydrazine may be added as a leveler, as disclosed in U.S. patent application Ser. No. 11/085,304. Levelers act with the stabilizer of the invention to further enhance deposition morphology and topography, and also to control the deposition rate.

In some applications, the bath must be substantially sodium free, or alkali metal ion free.

Employing the foregoing baths, a variety of alloys can be deposited. For example, Co diffusion barrier layers include Co—W—P, Co—W—B, Co—W—B—P, Co—B—P, Co—B, Co—Mo—B, Co—W—Mo—B, Co—W—Mo—B—P, and Co—Mo—P, among others. Ni diffusion barrier layers include Ni—Co—P, Ni—Mo—P, Ni—Mo—B—P, Ni—Co—B, and Ni—Co—Mo—B—P, among others.

According to the practice of electroless deposition, a layer of Co or Co alloy may be deposited by exposure of the electroless plating compositions to, for example, a patterned silicon substrate having vias and trenches, in which a metal layer, such as Cu, has already filled into the vias or trenches. This exposure may comprise dip, flood immersion, spray, or other manner of exposing the substrate to a deposition bath, with the provision that the manner of exposure adequately achieves the objectives of depositing a metal layer of the desired thickness and integrity.

In applications where the invention is used for capping, surface preparation may be needed for removing organic residues left by CMP and for dissolving Cu oxide from the Cu surface. Unless removed, the oxide can interfere with adhesion of the cap and can detract from electrical conductivity.

Acidic pretreatment involves exposing the substrate to an acid selected from among HCl, $H_2SO_4$, citric acid, methanesulfonic acid, and $H_3PO_4$ to remove CMP residues, Cu oxides, and Cu embedded in the dielectric by CMP. After the acidic pretreatment operation is completed, the substrate is rinsed by, e.g., DI water.

Alternatively or additionally, an alkaline pretreatment employs basic cleaner for removing oxide from the metal interconnect feature. This cleaner preferably removes all the oxide, for example copper oxide, without removing substantial amounts of the metallization in the interconnects. Typical basic cleaners contain TMAH with addition of hydroxylamine, MEA, TEA, EDA (ethylenediamine), or DTA (diethylenetriamine) at pH range of 9 to 12. A water rinse follows the alkaline pretreatment.

The electroless plating compositions according to the present invention may be used in conventional continuous mode deposition processes. In the continuous mode, the same bath volume is used to treat a large number of substrates. In this mode, reactants must be periodically replenished, and reaction products accumulate, necessitating periodic removal of the plating bath. Preferably, in this mode, the bath contains an initially high concentration of metals ions for depositing onto the substrate. Alternatively, the electroless plating compositions according to the present invention are suited for so-called "use-and-dispose" deposition processes. In the use-and-dispose mode, the plating composition is used to treat a substrate, and then the bath volume is directed to a waste stream. Although this latter method may be more expensive, the use and dispose mode requires no metrology, that is, measuring and adjusting the solution composition to maintain bath stability is not required. It is advantageous from a cost perspective to use lower concentrations of metal ions when working in "use-and-dispose" mode.

For auto-catalyzation of the electroless deposition, borane-based reducing agents may be employed such as, for example borohydrides (sodium, potassium, cyano-, trimethoxy, and tetramethylammonium, among others), monomethyl amine borane, isopropyl amine borane, dimethyl amine borane (DMAB), diethyl amine borane (DEAB), trimethyl amine borane, triethyl amine borane, triisopropyl amine borane, pyridine borane, and morpholine borane, mixtures thereof, or mixtures thereof with hypophosphite. Oxidation/reduction reactions involving the borane-based reducing agents and Co or Ni alloy deposition ions are catalyzed by Cu. In particular, at certain plating conditions, e.g., pH & temperature, the reducing agents are oxidized in the presence of Cu, thereby reducing the deposition ions to metal which deposits on the Cu. The process is preferably substantially self-aligning in that the metal is deposited essentially only on the Cu interconnect. However, conventional electroless plating baths deposit a Co alloy that amplifies the roughness of the underlying Cu interconnect. In many instances, stray Co is deposited onto the dielectric. If the additives are added to the plating solution, as in the present invention, the electroless plating bath deposits a smooth and level Co or Ni alloy capping layer without stray deposition onto the dielectric.

As an alternative, certain embodiments of the invention employ an electroless deposition process which does not employ a reducing agent which renders Cu catalytic to metal deposition. For such processes a surface activation operation is employed to facilitate subsequent electroless deposition. A currently preferred surface activation process utilizes a Pd immersion reaction. Other known catalysts are suitable and include Rh, Ru, Pt, Ir, and Os. Alternatively, the surface may be prepared for electroless deposition by seeding as with, for example, Co seeding deposited by electroless deposition, electrolytic deposition, PVD, CVD, or other technique as is known in the art.

Plating typically occurs at a bath temperature of between about 50° C. to about 90° C. If the plating temperature is too low, the reduction rate is too low, and at a low enough temperature, Co reduction does not initiate at all. At too high a temperature, the plating rate increases, and the bath can become too active. For example, Co reduction can become less selective, and Co plating may occur not just on the Cu interconnect features of a wafer substrate, but also on the dielectric material. Further, at very high temperatures, Co reduction can occur spontaneously within the bath plating solution and on the sidewalls of the plating tank. Plating rates achievable using the electroless deposition compositions of the present invention may be between about 50 Å/minute and about 300 Å/minute. Plating typically occurs for between about 1 minute and about 3 minutes. As such, Co and Ni alloy capping layers having thicknesses between 50 Å and about 300 Å are routinely achieved, which capping layers are substantially defect free, uniform, and smooth as electrolessly deposited.

Optionally, the capping layers can be subjected to a post deposition cleaning to improve the yield.

The following examples further illustrate the invention.

EXAMPLE 1

Electroless Deposition Composition Comprising Stabilizer for Plating Ternary Alloy Comprising Co—W—P A first electroless plating bath was prepared comprising the following components:
20-40 g/L $CoCl_2.6H_2O$
40-80 g/L $C_6H_8O_7$ (citric acid)
10-30 g/L $H_3BO_3$ (boric acid)
4-12 g/L $H_2WO_4$ (tungstic acid)
10-20 g/L $H_3PO_2$ (hypophosphorous acid)
10-30 ppm $CH_3C(=NOH)C(=NOH)CH_3$ (dimethylglyoxime)

The electroless plating bath (1 L) was prepared at room temperature by preparing two solutions separately, Solution A (500 mL) and Solution B (500 mL), and combining the solutions to yield the electroless plating bath.

To prepare Solution A (500 mL):
1. $CoCl_2.6H_2O$ dissolved in water in an amount sufficient, upon dilution to 500 mL, to yield a concentration which was twice the final concentration.
2. Added citric acid and boric acid to the $Co^{2+}$ solution.
3. pH adjusted to about 7.0 using TMAH.
4. Pre-dissolved tungstic acid in TMAH aqueous solution added to the solution in an amount sufficient, upon dilution to 500 mL, to yield a concentration which was twice the final concentration.
5. Added surfactant if needed in an amount sufficient, upon dilution to 500 mL, to yield a concentration which was twice the final concentration.
6. pH adjusted to about 9.0 using TMAH.
7. Dimethylglyoxime added in an amount sufficient, upon dilution to 500 mL, to yield a concentration which was twice the final concentration.
8. pH readjusted to about 9.0 using TMAH
9. Diluted with water to 500 mL.
10. Filter to remove undissolved solids.

To Prepare Solution B (500 mL):
1. Hypophosphorous acid dissolved in water in an amount sufficient, upon dilution to 500 mL, to yield a concentration which was twice the final concentration.
2. Added citric acid and boric acid.
3. pH adjusted to about 9.0 using TMAH
4. Diluted with water to 500 mL.
5. Filtered to remove any solids.

To prepare the electroless plating bath
1. Combined 500 mL of Solutions A and B.
2. pH adjusted to between 8.0 and 9.5 with TMAH or citric acid, if needed.

This bath was used to plate a smooth and uniform deposit of the Co—W—P ternary alloy at a plating bath temperature between 65° C. and 80° C. Plating was initiated by Pd seeding. Plating for about 1 minute yielded a deposit having a thickness between about 100 Å and about 200 Å. Thus, the plating rate was between about 100 Å/min and about 200 Å/min. The deposited Co—W—P ternary alloy had an RMS between about 6 Å and about 10 Å, which was only slightly higher than the substrate roughness. Importantly, the selectivity of the deposit was good, without particles or stray deposition on the dielectric surface.

EXAMPLE 2

Electroless Deposition Composition Comprising Stabilizer for Plating Ternary Alloy Comprising Co—W—P A second electroless plating bath was prepared comprising the following components:
20-40 g/L $CoCl_2.6H_2O$
40-80 g/L $C_6H_8O_7$ (citric acid)
10-30 g/L $H_3BO_3$ (boric acid)
4-12 g/L $H_2WO_4$ (tungstic acid)
10-20 g/L $H_3PO_2$ (hypophosphorous acid)
5-30 ppm $C_7H_7NO_2$ (2-aminobenzoic acid)
pH adjusted to between 8.0 and 9.5.

One liter of this bath was prepared at room temperature according to a protocol similar to that described in Example 1.

This bath was used to plate a smooth and uniform deposit of the Co—W—P ternary alloy at a plating bath temperature between 65° C. and 80° C. Plating was initiated by Pd seeding. Plating for about 1 minute yielded a deposit having a thickness between about 100 Å and about 150 Å. Thus, the plating rate was between about 100 Å/min and about 150 Å/min. The deposited Co—W—P ternary alloy had an RMS between about 6 Å and about 10 Å, which was only slightly higher than the substrate roughness. Importantly, the selectivity of the deposit was good, without particles or stray deposition on the dielectric surface.

EXAMPLE 3

Electroless Deposition Composition Comprising Stabilizer for Plating Quaternary Alloy Comprising Co—W—Mo—P A third electroless plating bath was prepared comprising the following components:
20-40 g/L $CoCl_2.6H_2O$
40-80 g/L $C_6H_8O_7$ (citric acid)
0-30 g/L $H_3BO_3$ (boric acid)
2-6 g/L $H_2WO_4$ (tungstic acid)
5-15 g/L $H_3PO_2$ (hypophosphorous acid)
200-300 ppm Calfax 10LA-75 (Pilot Chemical Co.)
50-250 ppm $MoO_3$ (Molybdenum oxide)
pH adjusted to between 8.0 and 9.5.

One liter of this bath was prepared at room temperature according to a protocol similar to that described in Example 1.

This bath was used to plate a smooth and uniform deposit of the Co—W—Mo—P quaternary alloy at a plating bath temperature between 65° C. and 80° C. Plating was initiated by Pd seeding. Plating for about 1 minute yielded a deposit having a thickness between about 140 Å and about 180 Å. Thus, the plating rate was between about 140 Å/min and about 180 Å/min. The deposited Co—W—Mo—P quaternary alloy had an RMS between about 4 Å and about 8 Å, which was less than or equal to the substrate roughness. Importantly, the deposit uniformity across the deposit was good, without skipped plating or thickness difference.

EXAMPLE 4

Electroless Deposition Composition Comprising Grain Refiner for Plating Ternary Alloy Comprising Co—W—P A fourth electroless plating bath was prepared comprising the following components:
3-10 g/L $CoCl_2.6H_2O$
10-30 g/L $C_6H_8O_7$ (citric acid)
0-10 g/L $H_3BO_3$ (boric acid)
0.2-2.0 g/L $H_2WO_4$ (tungstic acid)
0-10 g/L Polyphosphoric Acid 115
4-12 g/L $H_3PO_2$ (hypophosphorous acid)
pH adjusted to between 8.0 and 9.5.

One liter of this bath was prepared at room temperature according to a protocol similar to that described in Example 1.

This bath was used to plate a smooth and uniform deposit of the Co—W—P ternary alloy at a plating bath temperature between 65° C. and 80° C. Plating was initiated by Pd seeding. Plating for about 1 minute yielded a deposit having a thickness between about 80 Å and about 120 Å. Thus, the plating rate was between about 80 Å/min and about 120 Å/min. The deposited Co—W—P ternary alloy had an RMS between about 4 Å and about 8 Å, which was approximately equal to the substrate roughness. Importantly, the deposit had smaller grain sizes and better uniformity.

EXAMPLE 5

Electroless Deposition Composition Comprising Leveler for Plating Ternary Alloy Comprising Co—W—B A fifth electroless plating bath was prepared comprising the following components:
20-30 g/L $CoCl_2 \cdot 6H_2O$
30-60 g/L $C_6H_8O_7$ (citric acid)
10-20 g/L $NH_4Cl$ (ammonium chloride)
2-8 g/L $H_2WO_4$ (tungstic acid)
5-10 g/L $(CH_3)_2NHBH_3$ (DMAB)
200-500 ppm PPG 425
pH adjusted to between 8.0 and 9.5.

One liter of this bath was prepared at room temperature according to a protocol similar to that described in Example 1.

This bath was used to plate a smooth and uniform deposit of the Co—W—B ternary alloy at a plating bath temperature between 55° C. and 95° C. Because DMAB was used as the reducing agent, no Pd seeding was necessary to initiate deposition. Plating for about 1 minute yielded a deposit having a thickness between about 150 Å and about 250 Å. Thus, the plating rate was between about 150 Å/min and about 250 Å/min. The deposited Co—W—B ternary alloy had an RMS between about 10 Å and about 15 Å, which was slightly higher than the substrate. Importantly, the line roughness across different Cu grain faces decreased with the addition of the leveler compared to with the deposit plated without the leveler in the bath.

EXAMPLE 6

Electroless Deposition Composition Comprising Oxygen Scavenger for Plating Quaternary Alloy Comprising Co—W—B—P A sixth electroless plating bath was prepared comprising the following components:
20-30 g/L $CoCl_2 \cdot 6H_2O$
30-60 g/L $C_6H_8O_7$ (citric acid)
4-8 g/L $H_2WO_4$ (tungstic acid)
2-6 g/L $(CH_3)_2NHBH_3$ (DMAB)
5-15 g/L $NH_4H_2PO_2$ (Ammonium hypophosphite)
0.5-2 g/L Ascorbic acid
pH adjusted to between 8.0 and 9.5.

One liter of this bath was prepared at room temperature according to a protocol similar to that described in Example 1.

This bath was used to plate a smooth and uniform deposit of the Co—W—B—P quaternary alloy at a plating bath temperature between 55° C. and 95° C. Because DMAB was used as the reducing agent, no Pd seeding was necessary to initiate deposition. Plating for about 1 minute yielded a deposit having a thickness between about 100 Å and about 150 Å. Thus, the plating rate was between about 100 Å/min and about 150 Å/min. The deposited Co—W—B—P quaternary alloy had an RMS between about 6 Å and about 10 Å, which was only slightly higher than the substrate roughness.

EXAMPLE 7

Electroless Deposition Composition Comprising Stabilizer for Plating Quaternary Alloy Comprising Co—W—B—P A seventh electroless plating bath was prepared comprising the following components:
3-10 g/L $CoCl_2 \cdot 6H_2O$
10-30 g/L $C_6H_8O_7$ (citric acid)
0-10 g/L $H_3BO_3$ (boric acid)
0.2-2.0 g/L $H_2WO_4$ (tungstic acid)
4-8 g/L $H_3PO_2$ (hypophosphorous acid)
0.3-5 g/L $(CH_3)_2NHBH_3$ (DMAB)
0.2-5 g/L salicylic acid
pH adjusted to between 8.0 and 9.5.

One liter of this bath was prepared at room temperature according to a protocol similar to that described in Example 1.

This bath was used to plate a smooth and uniform deposit of the Co—W—B—P quaternary alloy at a plating bath temperature between 65° C. and 80° C. Because DMAB was used as the reducing agent, no Pd seeding was necessary to initiate deposition. Plating for about 1 minute yielded a deposit having a thickness between about 80 Å and about 120 Å. Thus, the plating rate was between about 80 Å/min and about 120 Å/min. The deposited Co—W—B—P quaternary alloy had an RMS between about 8 Å and about 12 Å, which was only slightly higher than the substrate roughness. Importantly, the bath stability was improved, resulting in less particle formation on the deposit.

EXAMPLE 8

Alloys Depositing from Electroless Deposition Compositions with and without Stabilizer To illustrate the advantages of the dimethylglyoxime stabilizer of the present invention, ternary alloys comprising Co, W, and P were electrolessly deposited from the electroless deposition composition of Example 1 onto a starting silicon substrate. The substrate had exposed patterned Cu wires embedded in Ta/TaN stack barrier surrounded with interlevel dielectric (ILD) made of $SiO_2$-based material. The Cu wires had a width on the order of 120 nm, and after CMP, the Cu surface was lower than the surrounding dielectric. The surface roughness was about 5 Å.

The patterned Cu substrate was exposed to a preclean solution of 1% sulfuric acid to remove post-CMP inhibitor residues, copper (II) oxide layer, and post-CMP slurry particles from ILD. It was then rinsed in deionized (DI) water, and subsequently activated with Pd.

To plate the alloy, the substrate was immersed in the Co—W—P electroless deposition composition of Example 1. The baths were kept at 75° C., at a pH of about 9.0, and plating occurred for 1 minute.

Under experimental conditions, this bath plated a 180 Å thick Co—W—P alloy layer onto the copper substrate with a surface roughness of about 8 Å. Thus, there was minimal increase in the surface roughness of the Co—W—P alloy layer plated with the bath of the present invention compared to the underlying copper substrate surface roughness. Additionally, the layer was substantially free of nodular growth at the layer edges.

Figure 1B:
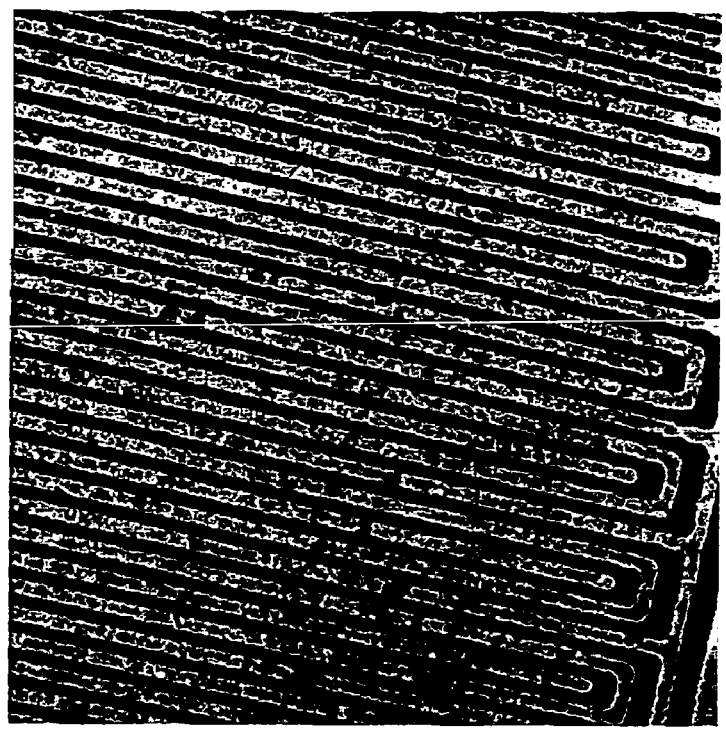

For comparison, a substrate was immersed in a comparative Co—W—P electroless deposition solution of Example 1 in all respects except with no dimethylglyoxime stabilizer. FIG. 1A is an image of the substrate plated without the dimethylglyoxime stabilizer, and FIG. 1B is an image of the substrate plated with the dimethylglyoxime stabilizer. As can be seen in FIG. 1A, severe nodulation along the Cu/dielectric barrier interface and particle formation on the dielectric surface are observed for the cap plated from the dimethylglyoxime stabilizer-free bath. This Co—W—P capping layer has an increased risk of causing an electrical short. The nodulation and particle formation is substantially reduced in the Co—W—P capping layer deposited from the bath comprising dimethylglyoxime. See FIG. 1B, which is an AFM image of a comb structure showing very low density of nodules or particles on dielectric surfaces or along the Cu/dielectric barriers.

EXAMPLE 9

Figure 2B:
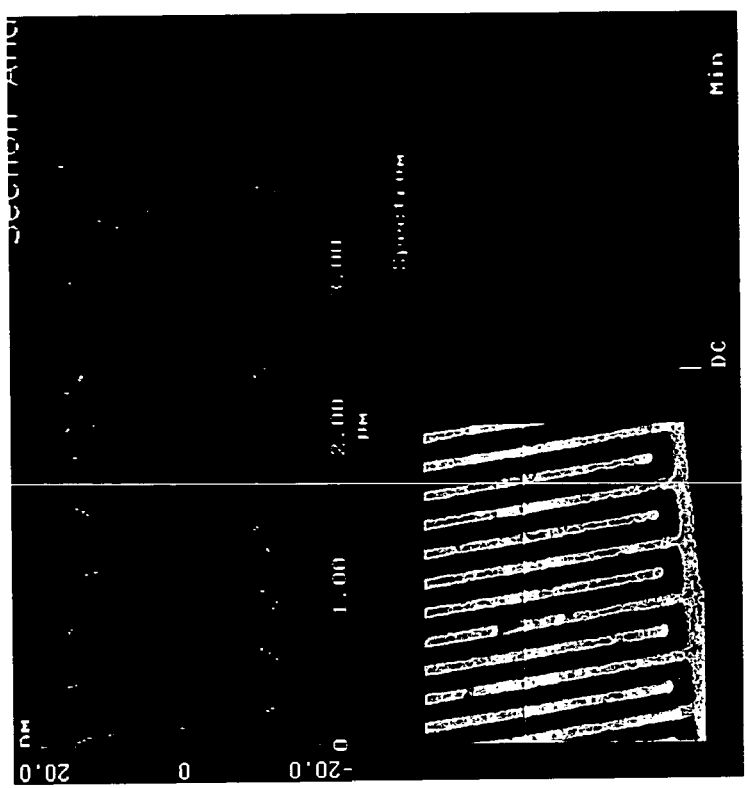
FIGS. 2A and 2B are AFM images showing Co alloy deposits prepared according to the method described in Example 9.
Figure 2A:
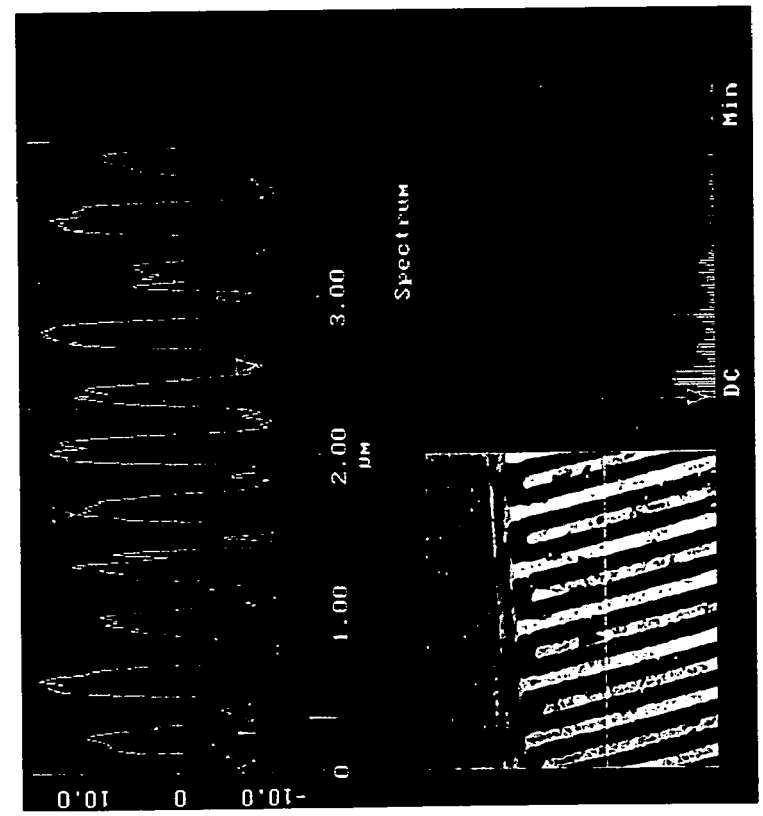

Alloys Depositing from Electroless Deposition Compositions with and without Leveler Improved surface uniformity and roughness may be achieved in a Co—W—B layer deposited from an electroless plating bath comprising levelers acting as surfactants or surface tension reducers according to the present invention. FIGS. 2A and 2B are AFM images of a Co alloy deposited from electroless deposition compositions. FIG. 2A is an image of a Co alloy deposited from a composition not comprising a leveler. FIG. 2B is an image of a Co alloy deposited from a composition comprising a leveler.

The more uniform and smoother surface of the Co—W—B layer shown in FIG. 2B was deposited from a bath of Example 5 containing 500 ppm PPG 425. The mean surface roughness was approximately 8 Å, which is a minimal increase in the surface roughness of the alloy layer plated with the bath of the present invention compared to the underlying copper substrate surface roughness (which was 6 Å). The Co—W—B layer shown in FIG. 2A was deposited from a plating bath not containing PPG 425. The mean surface roughness was approximately 13 Å, which is significantly rougher than the underlying copper substrate surface roughness.

EXAMPLE 10

Figure 3B:
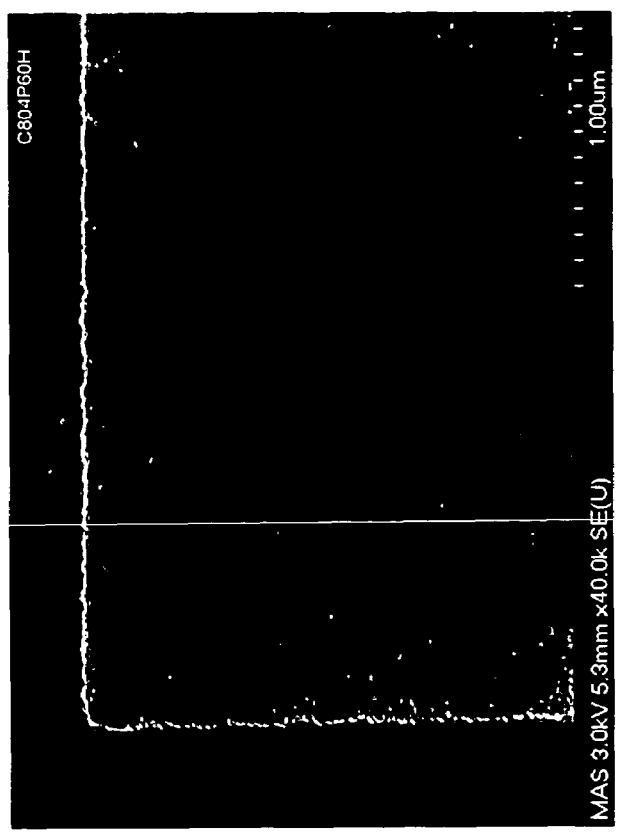
FIGS. 3A, 3B, 3C, and 3D are SEM photographs showing Co alloy deposits prepared according to the methods described in Example 10.
Figure 3A:
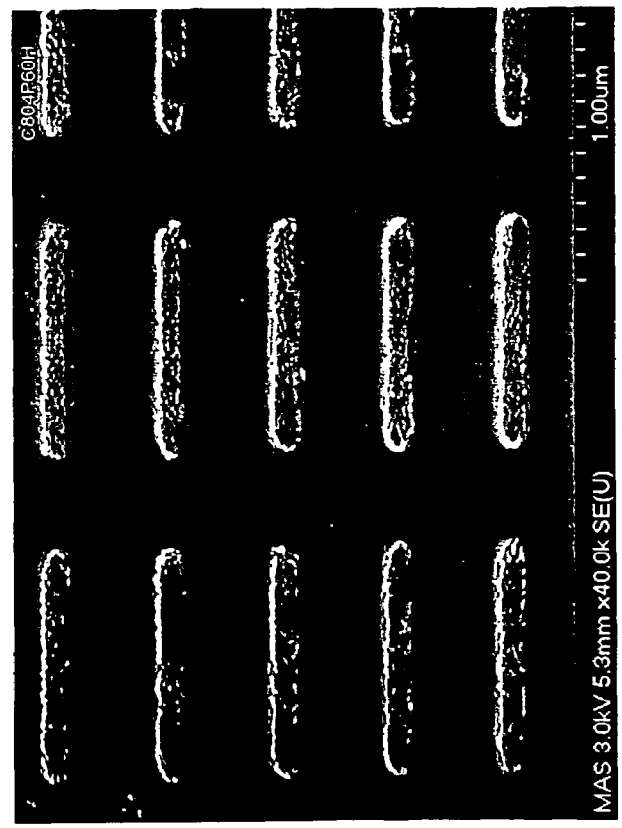
Figure 3D:
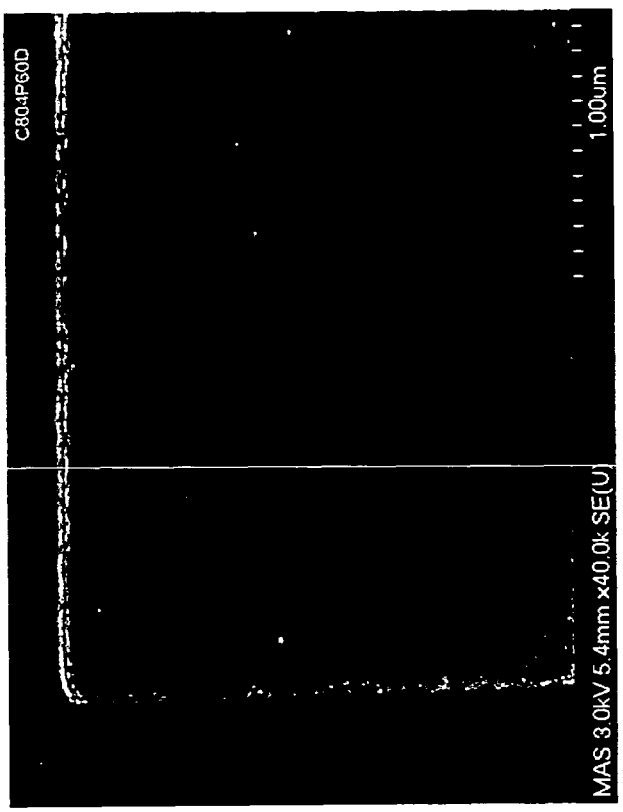
Figure 3C:
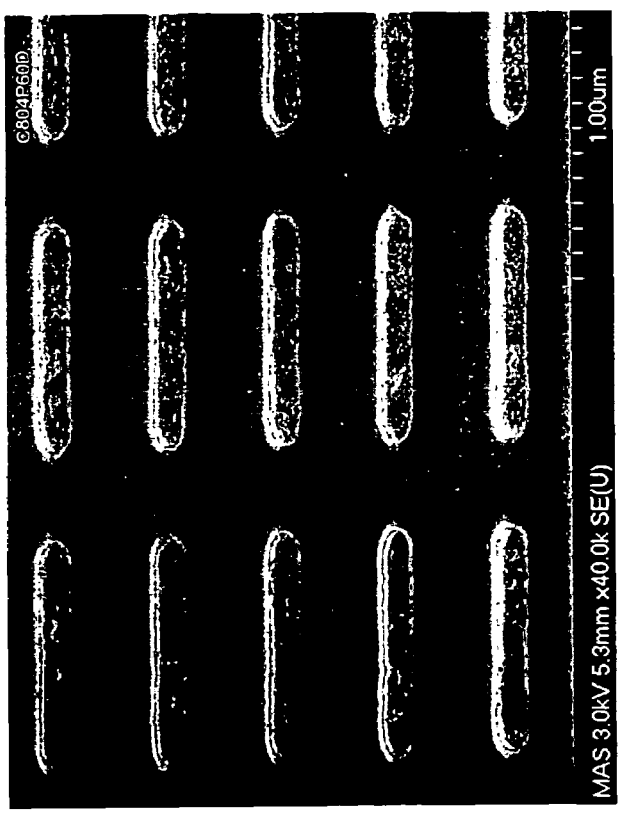

Alloys Depositing from Electroless Deposition Compositions with and without Grain Refiner Improved surface roughness and granularity may be achieved in a Co—W—P layer deposited from an electroless plating bath comprising grain refiners according to the present invention. FIGS. 3A, 3B, 3C, and 3D are AFM images of a Co alloy deposited from electroless deposition compositions. FIGS. 3A and 3B are images of a Co alloy deposited from a composition not comprising a grain refiner. FIGS. 3C and 3D are images of a Co alloy deposited from a composition comprising a grain refiner.

The Co—W—P layer having improved surface roughness, significantly reduced grain decoration, and improved granularity shown in FIGS. 3C and 3D was deposited from the bath of Example 4 containing 10 g/L polyphosphoric acid. AFM data indicated the surface roughness may have actually decreased compared to the underlying Cu substrate. The mean surface roughness was approximately 5 Å for 10 nm thick deposit compared to the mean surface roughness of the Cu substrate of about 5 Å. Most of the baths tested having added polyphosphoric acid showed better selectivity with clean dielectric surface, especially for low-k porous dielectric materials which tend to be problematic. The Co—W—P layer shown in FIGS. 3A and 3B exhibits grain decoration and poor granularity. This alloy was plated from a bath which does not comprise the grain refiner. The mean surface roughness for this layer was about 8 Å for about 10 nm thick deposit, which is higher than the copper substrate (mean surface roughness of approximately 5 Å).

In view of the above, it will be seen that the several objects of the invention are achieved and other advantageous results attained.

When introducing elements of the present invention or the preferred embodiment(s) thereof, the articles "a", "an", "the" and "said" are intended to mean that there are one or more of the elements. For example, that the foregoing description and following claims refer to "an" interconnect means that there are one or more such interconnects. The terms "comprising", "including" and "having" are intended to be inclusive and mean that there may be additional elements other than the listed elements.

As various changes could be made in the above without departing from the scope of the invention, it is intended that all matter contained in the above description and shown in the accompanying drawings shall be interpreted as illustrative and not in a limiting sense.

What is claimed is:

1. An electroless deposition composition for electrolessly depositing Co, Ni, or alloys thereof onto a substrate in manufacture of microelectronic devices, the deposition composition comprising (a) a source of deposition ions selected from the group consisting of Co ions and Ni ions, (b) a reducing agent for reducing said deposition ions onto the substrate, and (c) a stabilizer comprising a molybdenum oxide;

wherein the molybdenum oxide is selected from the group consisting of $MoO_3$ predissolved with TMAH; $(NH_4)_2MoO_4$; and a combination thereof; and wherein the stabilizer is present in the electroless deposition composition at a concentration between about 10 ppm and about 800 ppm.

2. An electroless deposition composition for electrolessly depositing Co, Ni, or alloys thereof onto a substrate in manufacture of microelectronic devices, the deposition composition comprising (a) a source of deposition ions selected from the group consisting of Co ions and Ni ions, (b) a reducing agent for reducing said deposition ions onto the substrate, and (c) a stabilizer comprising a molybdenum oxide;

wherein the molybdenum oxide is selected from the group consisting of $(NH_4)_2Mo_2O_7$; dimolybdates $(Me_2Mo_2O_7 \cdot nH_2O)$; metamolybdates $(Me_2H_{10-m}[H_2(Mo_2O_7)_6] \cdot nH_2O)$; and combinations thereof;

wherein Me is a counterion selected from among ammonium, tetramethylammonium, and alkali metal cations; m is less than 10; and n is an integer having a value corresponding to a stable or metastable form of the hydrated oxide;

wherein the stabilizer is present in the electroless deposition composition at a concentration between about 10 ppm and about 800 ppm.

3. An electroless deposition composition for electrolessly depositing Co, Ni, or alloys thereof onto a substrate in manufacture of microelectronic devices, the deposition composition comprising (a) a source of deposition ions selected from the group consisting of Co ions and Ni ions, (b) a reducing agent for reducing said deposition ions onto the substrate, and (c) a stabilizer comprising a vanadium oxide, wherein the vanadium oxide is pyrovanadates ($V_2O_7^{4-}$).

4. An electroless deposition composition for electrolessly depositing Co, Ni, or alloys thereof onto a substrate in manufacture of microelectronic devices, the deposition composition comprising (a) a source of deposition ions selected from the group consisting of Co ions and Ni ions, (b) a reducing agent for reducing said deposition ions onto the substrate, and (c) a stabilizer comprising a molybdenum oxide;

wherein the molybdenum oxide is a dimolybdate ($Me_2Mo_2O_7 \cdot nH_2O$), wherein Me is ammonium; and wherein the stabilizer is present in the electroless deposition composition at a concentration between about 10 ppm and about 800 ppm.

* * * * *